(12) United States Patent
Ishida et al.

(10) Patent No.: US 7,439,137 B2
(45) Date of Patent: Oct. 21, 2008

(54) METHOD FOR MANUFACTURING SEMICONDUCTOR DEVICE

(75) Inventors: Hiroyasu Ishida, Gunma (JP); Hirotoshi Kubo, Gunma (JP); Shouji Miyahara, Gunma (JP); Masato Onda, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 365 days.

(21) Appl. No.: 11/123,248

(22) Filed: May 6, 2005

(65) Prior Publication Data

US 2005/0255706 A1 Nov. 17, 2005

(30) Foreign Application Priority Data

May 12, 2004 (JP) ............... 2004-142389

(51) Int. Cl.
*H01L 21/336* (2006.01)
(52) U.S. Cl. ............ 438/270; 438/660; 438/423; 257/E21.375; 257/E21.419
(58) Field of Classification Search .......... 438/758, 438/270, 423, 268, 798, 659, 660; 257/E21.375, 257/E21.383, E21.384, E21.419, E21.42, 257/E21.429
See application file for complete search history.

(56) References Cited

U.S. PATENT DOCUMENTS

| | | | |
|---|---|---|---|
| 6,162,710 | A | 12/2000 | Ito et al. |
| 6,420,189 | B1 | 7/2002 | Lopatin |
| 6,436,723 | B1 | 8/2002 | Tomita et al. |
| 6,586,809 | B2 | 7/2003 | Segawa |
| 6,720,248 | B2 | 4/2004 | Ryo |
| 2001/0051411 | A1* | 12/2001 | Ito et al. .......... 438/268 |
| 2002/0081795 | A1* | 6/2002 | Kim et al. ......... 438/200 |
| 2002/0113317 | A1* | 8/2002 | Okushima ......... 257/774 |
| 2003/0006439 | A1* | 1/2003 | Bailey ............. 257/295 |

(Continued)

FOREIGN PATENT DOCUMENTS

JP 06-011713 1/1994

(Continued)

OTHER PUBLICATIONS

Taiwanese Office Action dated Jul. 30, 2007, directed to counterpart TW application No. 094110804.

(Continued)

*Primary Examiner*—Caridad M Everhart
(74) *Attorney, Agent, or Firm*—Morrison & Foerster LLP

(57) ABSTRACT

In a MOSFET, after an element region is formed, a wiring layer is formed subsequently to a barrier metal layer, and hydrogen annealing is performed. However, in the case of an n-channel MOSFET, a threshold voltage is lowered due to an occlusion characteristic of the barrier metal layer. Thus, an increased impurity concentration in a channel layer causes a problem that reduction in an on-resistance is inhibited. According to the present invention, after a barrier metal layer is formed, an opening is provided in the barrier metal layer on an interlayer insulating film, and hydrogen annealing treatment is performed after a wiring layer is formed. Thus, an amount of hydrogen which reaches a substrate is further increased, and lowering of a threshold voltage is suppressed. Moreover, since an impurity concentration in a channel layer can be lowered, an on-resistance is reduced.

7 Claims, 8 Drawing Sheets

U.S. PATENT DOCUMENTS

2005/0106847 A1* 5/2005 Hiruta et al. ............... 438/585
2006/0011973 A1* 1/2006 Mizukami et al. ........... 257/330
2006/0091453 A1* 5/2006 Matsuda et al. ............. 257/330

FOREIGN PATENT DOCUMENTS

| JP | 08-037236 | 2/1996 |
| JP | 2003-151917 | 5/2003 |
| KR | 1999-006812 | 1/1999 |
| KR | 2002-0086747 | 11/2002 |
| WO | WO-02/061845 | 8/2002 |
| WO | WO 02/061845 A1 | 8/2002 |

OTHER PUBLICATIONS

Chinese Office Action dated Sep. 21, 2007, directed to counterpart CN application No. 2005100674753.

* cited by examiner

|  |  | $V_{GSOFF}$ [ V ] | $R_{DSON}$ (VGS=4V) [ mΩ ] |
|---|---|---|---|
| Condition 1 | D1, hydrogen sintering treatment with a barrier metal layer | 0.67 | 20.7 |
| Condition 2 | D2, hydrogen sintering treatment with a barrier metal layer | 0.42 | 19.7 |
| Condition 3 | D2, hydrogen sintering treatment without a barrier metal layer | 1.36 | 21.8 |

Prior Art

Prior Art

METHOD FOR MANUFACTURING SEMICONDUCTOR DEVICE

BACKGROUND OF THE INVENTION

1. Field of the Invention

The present invention relates to a method of manufacturing a semiconductor device, and more particularly relates to a method of manufacturing a semiconductor device, which improves characteristics by allowing sufficient hydrogen to reach a substrate surface in hydrogen annealing treatment.

2. Description of the Related Art

With reference to FIGS. 11 to 13, description will be given of a conventional semiconductor device by taking an n-channel MOSFET having a trench structure as an example.

First, FIG. 11 shows a structure of a MOSFET 40. An n-type epitaxial layer 22 is laminated on an n+ type silicon semiconductor substrate 21 to provide a drain region, and a p-type channel layer 24 is provided thereon.

Trenches 27 are provided, which penetrate the channel layer 24 and reach the drain region 22. Inner walls of the trenches 27 are covered with a gate oxide film 31, and the trenches 27 are filled with polysilicon to form gate electrodes 33. In a surface of the channel layer 24 adjacent to the trenches 27, n+ type source regions 35 are formed. Moreover, in the surface of the channel layer 24 between the source regions 35 of two adjacent cells, p+ type body regions 34 are provided. Furthermore, when a gate voltage is applied to the gate electrodes 33, channel regions (not shown) are formed along the trenches 27 from the source regions 35. The gate electrodes 33 are covered with an interlayer insulating film 36. Thereafter, a barrier metal layer 37 is formed, which comes into contact with the source regions 35 and the body regions 34. Subsequently, a wiring layer 38 made of an aluminum alloy or the like, and a passivation film 41 are provided.

Next, description will be given of a conventional method of manufacturing a semiconductor device.

As shown in FIG. 12, the drain region 22 is formed by laminating an n− type epitaxial layer on the n+ type silicon semiconductor substrate 21. After an oxide film (not shown) is formed on a surface of the drain region 22, the oxide film in a portion of a channel layer is etched. By using this oxide film as a mask, boron is implanted over the entire surface of the resultant structure. Thereafter, boron is diffused to form the p-type channel layer 24.

Next, trenches are formed. By use of a CVD method, a CVD oxide film of NSG (Non-doped Silicate Glass) is formed on the entire surface of the resultant structure. Thereafter, a mask made of a resist film is provided thereon except portions of the CVD oxide film where the openings of the trenches are to be formed. Subsequently, the CVD oxide film is dry-etched to be partially removed. Thus, trench openings are formed, in which the channel layer 24 is exposed.

Furthermore, by using the CVD oxide film as a mask, the epitaxial layer 22 exposed from the trench opening is dry-etched with CF gas and HBr gas. Thus, the trench 27 is formed, which penetrates the channel layer 24 and reaches the drain region 22.

Thereafter, by performing dummy oxidation, a dummy oxide film (not shown) is formed on inner walls of the trenches 27 and on a surface of the channel layer 24. Accordingly, an etching damage in dry etching is eliminated. Thereafter, the dummy oxide film formed by the dummy oxidation and the CVD oxide film are simultaneously removed by use of an oxide film etchant such as hydrofluoric acid. Thus, a stable gate oxide film can be formed. Moreover, by performing thermal oxidation at a high temperature, the openings of the trenches 27 are made round. Accordingly, there is also achieved an effect of preventing field concentration in the openings of the trenches 27. Thereafter, a gate oxide film 31 is formed. Specifically, by thermally oxidizing the entire surface of the resultant structure, the gate oxide film 31 is formed to have a thickness of about several hundred Å, for example, according to a threshold thereof.

Subsequently, a non-doped polysilicon layer is deposited on the entire surface of the resultant structure, and high concentration of phosphorus is implanted and diffused to achieve a high conductivity. The polysilicon layer deposited on the entire surface of the resultant structure is dry-etched without using a mask to leave gate electrodes 33 buried in the trenches 27.

Next, as shown in FIG. 13, the body regions 34 for stabilizing a potential of the substrate, and the source regions 35 are formed. First, boron ions are selectively implanted by using a mask made of a resist film, and then the resist film is removed. Moreover, a new resist film is deposited so as to expose the predetermined source regions 35 and gate electrodes 33. Thereafter, ion implantation of arsenic is performed to remove the resist film. Subsequently, a BPSG (Boron Phosphorus Silicate Glass) layer is deposited on the entire surface of the resultant structure by use of the CVD method, and impurities are diffused. Thus, the body regions 34 and the source regions 35 are formed. Thereafter, the BPSG layer is etched by use of a resist film as a mask, and the interlayer insulating film 36 is left at least on the gate electrodes 33.

Furthermore, in order to form a wiring layer as shown in FIG. 11, the barrier metal layer 37 is first provided. Specifically, the barrier metal layer 37 is formed by sputtering Ti/TiN or the like on the entire surface of the resultant structure. Subsequently, an aluminum alloy to be the wiring layer 38 is sputtered on the entire surface of the resultant structure. Thereafter, heat treatment is performed in order to stabilize the metal and the silicon surface. This heat treatment is performed for about 30 minute s at a temperature of 300 to 500° C. (for example, about 400° C.), which is below a melting point of the aluminum alloy, in hydrogen-containing gas. Subsequently, for surface protection, a passivation film made of SiN or the like is formed. Furthermore, in order to eliminate a damage, heat treatment is performed for about 30 minutes at 300 to 500° C. (for example, 400° C.). Thus, the final structure shown in FIG. 11 is obtained. This technology is described for instance in Japanese Patent Application Publication No. Hei 8-37236.

As described above, as a wiring used for a semiconductor device including a silicon substrate, an aluminum-based metal material, such as an aluminum alloy, is generally used. Moreover, it is required to perform heat treatment to achieve an ohmic characteristic in an interface between Al (aluminum) and a Si (silicon) substrate.

However, because of a high diffusion rate of Si in Al, Al and Si are diffused to cause a phenomenon called a spike which destroys a pn junction. In order to prevent this phenomenon, Si is previously contained in Al.

If Si is contained in Al, Si contained in Al is diffused and undergoes grain growth by heat treatment. Accordingly, a Si nodule may be deposited on a contact interface with the substrate. This Si nodule becomes a factor that causes a contact failure by blocking a contact region between a body region, that is a minute region, and a wiring layer. Moreover, since the Si nodule itself has a high resistance, the Si nodule becomes a factor that causes an unstable contact resistance or increases a contact resistance.

In order to prevent the problems described above, a barrier metal layer made of titanium-based metal is formed before the wiring layer (Al) is formed.

Furthermore, due to oxidation performed in an element region formation step, and the like, a dangling bond in which a Si bonding hand is cut off may exist in a surface of the substrate. In this case, the surface is considered to be negatively charged. In other words, due to a potential generated, the substrate is set in the same state as where an electric field is applied to the surface thereof Accordingly, there occurs a variation in a threshold voltage.

Thus, in the conventional MOSFET described above, after formation of an element region, the barrier metal layer 37 and the wiring layer 38 are sequentially formed in a wiring layer formation step. Thereafter, heat treatment is performed in hydrogen-containing gas.

Specifically, heat treatment for achieving the ohmic characteristic in the interface between Al and the silicon substrate is performed in the hydrogen-containing gas. Accordingly, hydrogen is allowed to reach the substrate interface and the like, and silicon which has lost relation with each other and hydrogen are bonded. Thus, charges on the substrate interface can be removed. Therefore, improvement in characteristics (for example, a reduction in a dark current) and stability in characteristics (for example, stability in a threshold voltage $V_{GSOFF}$) can be achieved.

However, depending on a kind of a barrier, a desired threshold voltage $V_{GSOFF}$ may not be obtained even if heat treatment in a hydrogen-containing gas atmosphere (hereinafter referred to as hydrogen annealing) is performed.

Accordingly, the following is considered as a cause of a shift in the threshold voltage $V_{GSOFF}$. Specifically, since the titanium-based metal, that is the barrier metal layer, has a hydrogen occlusion property, hydrogen is occluded by the barrier metal layer before reaching an interface between the semiconductor substrate and the gate oxide film in a hydrogen annealing step. Thus, an amount of hydrogen which contributes to elimination of charges generated on the Si interface is reduced.

As an example, in an n-channel MOSFET having a trench structure, since a threshold voltage $V_{GSOFF}$ is shifted down (the threshold voltage drops), it is required to increase a concentration of impurities implanted into a channel layer, in order to obtain a desired threshold. Thus, there is a problem that an on-resistance is increased.

Specifically, in the conventional method, there is a problem that a substantial effect of hydrogen annealing treatment for removing charges of the substrate is not obtained due to the barrier metal layer which prevents the spike and avoids the contact failure caused by the Si nodule.

SUMMARY OF THE INVENTION

The present invention provides a method of manufacturing a semiconductor device. The method includes providing a silicon semiconductor substrate, forming an insulating film that covers part of the substrate, forming a first metal layer on the substrate and the insulating film, the first metal layer having an opening to expose part of the insulating film, forming a second metal layer on the first metal layer and the exposed part of the insulating film, and introducing hydrogen into the substrate through the opening of the first metal layer.

The present invention also provides a method of manufacturing a semiconductor device. The method includes providing a silicon semiconductor substrate of a first general conductivity type, forming a channel layer of a second general conductivity type on the substrate, forming a gate electrode which comes into contact with the channel layer through an insulating film; forming an impurity region of the first general conductivity type in the channel layer and adjacent the gate electrode, forming an interlayer insulating film on the gate electrode, forming a first metal layer on the channel layer and the interlayer insulating film so as to be in contact with the impurity region, the first metal layer having an opening to expose part of the interlayer insulating film, forming a second metal layer on the first metal layer and the exposed part of the interlayer insulating film, and introducing hydrogen into the channel layer through the opening of the first metal layer.

The present invention further provides a method of manufacturing a semiconductor device. The method includes providing a silicon semiconductor substrate of a first general conductivity type that operates as a drain, forming a channel layer of a second general conductivity type on the substrate, forming a trench that penetrates through the channel layer, filling the trench with a conductive material to form a gate electrode; forming a source region of the first general conductivity type in the channel layer and adjacent the gate electrode, forming a body region of the second general conductivity type in the channel layer and adjacent the source region, forming an interlayer insulating film on the gate electrode, forming a first metal layer on the channel layer and the interlayer insulating film so as to be in contact with the source region and the body region, the first metal layer having an opening to expose part of the interlayer insulating film, forming a second metal layer on the first metal layer and the exposed part of the interlayer insulating film, and introducing hydrogen into the substrate through the opening of the first metal layer.

According to the manufacturing method of the present invention, first, in a semiconductor device in which an element region on a surface of a silicon substrate and a barrier metal layer come into contact with each other, after the barrier metal layer is formed, an opening is provided in the barrier metal layer on an insulating film. Moreover, after a wiring layer is formed, hydrogen annealing treatment is performed. Thus, sufficient hydrogen can be allowed to reach the surface of the silicon substrate, and a dangling bond can be terminated.

Specifically, charges generated on the surface of the substrate by diffusion of hydrogen can be removed. Thus, improvement and stability in characteristics of an element can be realized. To be more specific, in an insulating gate type semiconductor device, a desired threshold voltage $V_{GSOFF}$ can be obtained.

Therefore, for example, in an n-channel MOSFET, it is no longer required to increase an impurity concentration in a channel layer more than necessary in order to obtain a desired threshold voltage $V_{GSOFF}$, which can contribute to a reduction in an on-resistance.

Moreover, by forming the opening of the barrier metal layer in a part of the insulating film, the element region is covered with the barrier metal layer, and an Al layer that is the wiring layer and the silicon substrate do not come into contact with each other. Therefore, diffusion caused by heat treatment after formation of the wiring layer can be prevented, and deposition of silicon nodules can be suppressed.

Particularly, in a MOSFET having a trench structure, an opening is also provided on the interlayer insulating film, and the source region and the body region are covered with the barrier metal layer. Specifically, the Al layer that is the wiring layer and the silicon substrate do not come into contact with each other. Thus, deposition of the silicon nodules can be suppressed. Therefore, a contact region between the body region, that is a minute region, and the wiring layer is not blocked, and a potential of the substrate is stabilized.

Second, the opening can be formed only by adding a step of etching a part of the barrier metal layer on the insulating film. Thus, sufficient hydrogen can be allowed to reach the substrate. Since diffusion of hydrogen proceeds isotropically from the opening, sufficient hydrogen passing through the opening can be allowed to reach the substrate. Therefore, under hydrogen annealing conditions similar to those of the conventional case, an amount of hydrogen which reaches the substrate can be increased.

Particularly, in the MOSFET having the trench structure, the opening of the barrier metal layer can be formed by use of a mask for trench formation. Specifically, an opening can be provided only on the interlayer insulating film without newly creating a mask for the opening. Therefore, it is possible to provide a method of manufacturing a semiconductor device, which prevents an increase in the number of masks, and obtains a desired threshold voltage $V_{GSOFF}$.

DESCRIPTION OF THE EMBODIMENTS

With reference to FIGS. 1 to 10B, detailed description will be given of an embodiment of the present invention by taking an n-channel MOSFET having a trench structure as an example.

Figure 1:
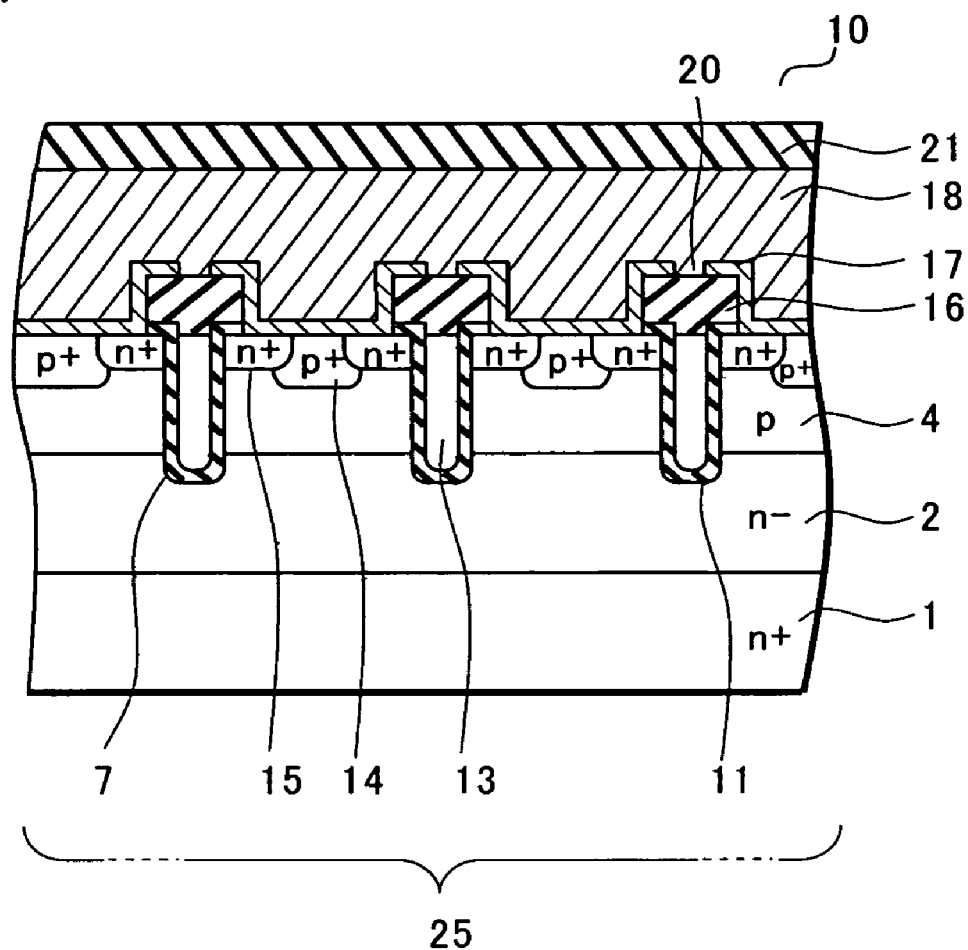
FIG. 1 is a cross-sectional view showing a semiconductor device according to an embodiment of the present invention.
Figure 2:
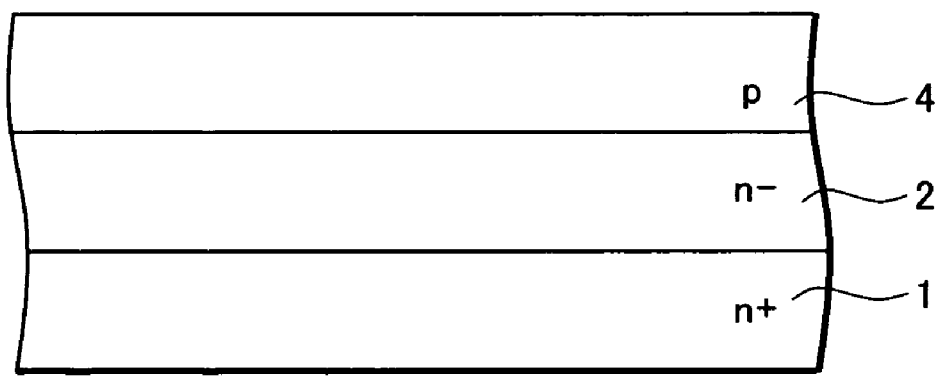
FIG. 2 is a cross-sectional view showing a method of manufacturing a semiconductor device according to the embodiment of the present invention.

FIG. 1 is a cross-sectional view showing a structure of a MOSFET 10 of the present invention. The MOSFET 10 includes a silicon semiconductor substrate 1, a semiconductor layer 2, a channel layer 4, a trench 7, an insulating film 11, a gate electrode 13, a source region 15, a body region 14, an interlayer insulating film 16, a first metal layer 17, an opening 20, and a second metal layer 18.

A drain region is formed by laminating an n− type epitaxial layer 2 on the n+ type silicon semiconductor substrate 1, and the like.

The channel layer 4 is a region obtained by diffusing p-type impurities on a surface of the n− type semiconductor layer 2. The trench 7 is provided so as to penetrate the channel layer 4 and to have a depth reaching the drain region 2. An inner wall of the trench 7 is covered with a gate oxide film 11 having a film thickness according to a drive voltage. Moreover, the gate electrode 13 is provided, which is made of a conductive material buried in the trench 7.

In a surface of the channel layer 4 adjacent to the trench 7, the source region 15 of n+ type is provided. Moreover, in the surface of the channel layer 4 between the adjacent source regions 15, the body region 14 of a p+ type is provided. The source region 15 abuts on the gate electrode 13 with the gate oxide film 11 interposed therebetween.

The trench 7 is formed by a pattern of a lattice, for example. A region surrounded by the trench 7 becomes one of cells of the MOSFET. A number of these cells are arranged to form an element region 25.

The interlayer insulating film 16 is provided so as to cover at least the gate electrode 13 and cover an opening of the trench 7.

The first metal layer 17 comes into contact with the source region 15 and the body region 14. The first metal layer 17 is a metal layer containing Ti (for example, Ti, TiN, TiON, TiW or the like). In this embodiment, description will be given by using a Ti/TiN laminated film as an example. The first metal layer becomes a barrier metal layer 17 which prevents diffusion caused by heat treatment, and suppresses deposition of silicon nodules. The barrier metal layer 17 is provided so as to also cover the interlayer insulating film 16, and has the opening 20 in a part thereof.

The second metal layer 18 is a wiring layer which is made of Al or the like, generally contains silicon for preventing a spike, and is patterned in a desired wiring shape.

In this embodiment, the opening 20 is provided in the barrier metal layer 17 on the interlayer insulating film 16. Thus, in hydrogen annealing treatment to be described later after the wiring layer is formed, sufficient hydrogen can be allowed to reach the surface of the silicon substrate (the channel layer 4) from the opening 20. Meanwhile, surfaces of the source region 15 and the body region 14 can surely come into contact with the barrier metal layer 17.

Therefore, an amount of hydrogen which reaches the surface of the substrate can be increased, and a desired threshold voltage $V_{GSOFF}$ can be obtained, while preventing diffusion and suppressing deposition of the silicon nodules by use of the barrier metal layer 17.

Accordingly, for example, in the n-channel MOSFET, the desired threshold voltage $V_{GSOFF}$ can be obtained without increasing an impurity concentration in the channel layer more than necessary. Thus, an on-resistance can be reduced.

With reference to FIGS. 2 to 9, description will be given of a manufacturing method of the present invention by taking an n-channel MOSFET having a trench structure as an example.

First step (see FIG. 2): forming an opposite conductivity type channel layer on a silicon semiconductor substrate to be a drain region.

A drain region is formed by laminating an n− type semiconductor layer (epitaxial layer) 2 on an n+ type silicon semiconductor substrate 1, and the like. After an oxide film (not shown) is formed on a surface of the drain region, the oxide film in a portion of a channel layer is etched. By using this oxide film as a mask, a p-type impurity (for example, boron) is implanted over the entire surface of the resultant structure. Thereafter, the impurity is diffused to form a channel layer 4.

Second step (see FIGS. 3A and 3B): forming a trench which penetrates the channel layer.

Figure 3A:
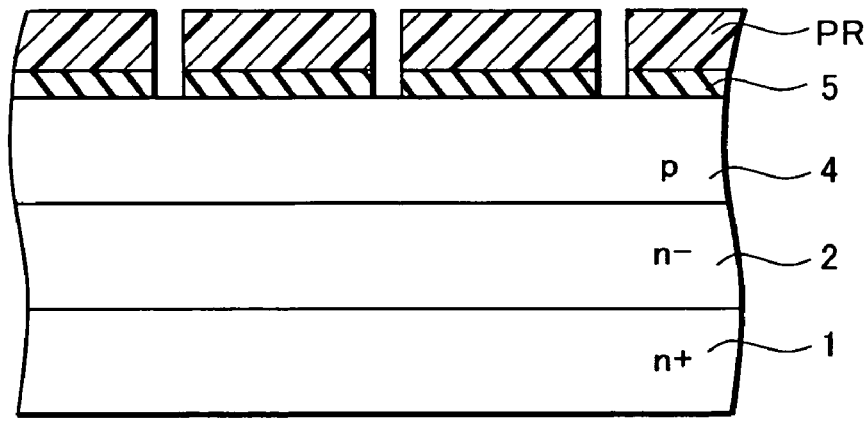
FIGS. 3A and 3B are cross-sectional views showing the method of manufacturing a semiconductor device according to the embodiment of the present invention.

By use of a CVD method, a CVD oxide film 5 of NSG (Non-doped Silicate Glass) is formed on the entire surface of the resultant structure. Thereafter, a resist mask PR for trench formation is provided. Subsequently, the CVD oxide film 5 is dry-etched to be partially removed. Thus, a trench opening is formed, in which the channel layer 4 is exposed (FIG. 3A).

Figure 3B:
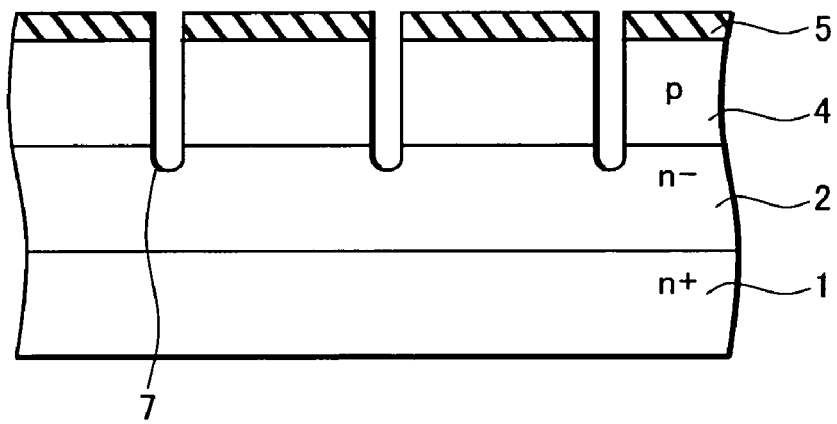
Figure 4:
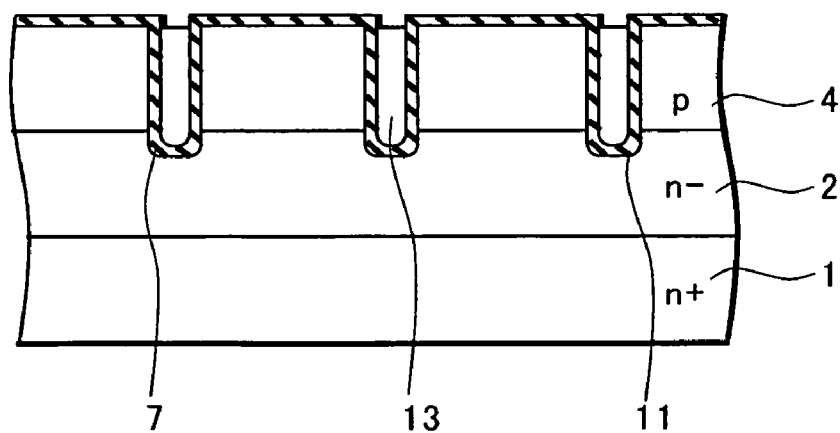
FIG. 4 is a cross-sectional view showing the method of manufacturing a semiconductor device according to the embodiment of the present invention.

Furthermore, by using the CVD oxide film 5 as a mask, the epitaxial layer 2 exposed from the trench opening is dry-etched with CF gas and HBr gas. Thus, a trench 7 is formed, which penetrates the channel layer 4 and reaches the drain region 2 (FIG. 3B).

Third step (see FIG. 4): burying a gate electrode in the trench with an insulating film interposed therebetween.

First, by performing dummy oxidation, a dummy oxide film (not shown) is formed on an inner wall of the trench 7 and on a surface of the channel layer 4. Accordingly, an etching damage in dry etching is eliminated. Thereafter, the dummy oxide film formed by the dummy oxidation and the CVD oxide film are simultaneously removed by use of an oxide film etchant such as hydrofluoric acid. Thus, a stable gate oxide film can be formed. Moreover, by performing thermal oxidation at a high temperature, the opening of the trench 7 is made round. Accordingly, there is also achieved an effect of preventing field concentration in the opening of the trench 7. Thereafter, a gate oxide film 11 is formed. Specifically, by thermally oxidizing the entire surface of the resultant structure, the gate oxide film 11 is formed to have a thickness of several hundred Å according to a threshold thereof Subsequently, a non-doped polysilicon layer is deposited on the entire surface of the resultant structure, and high concentration of phosphorus or the like is implanted and diffused to achieve a high conductivity. The polysilicon layer deposited on the entire surface of the resultant structure is dry-etched without using a mask to leave a gate electrode 13 buried in the trench 7.

Fourth step (see FIGS. 5A and 5B): forming a one conductivity type source region in a surface of the channel layer adjacent to the gate electrode, and forming an opposite conductivity type body region in the surface of the channel layer adjacent to the source region.

Figure 5A:
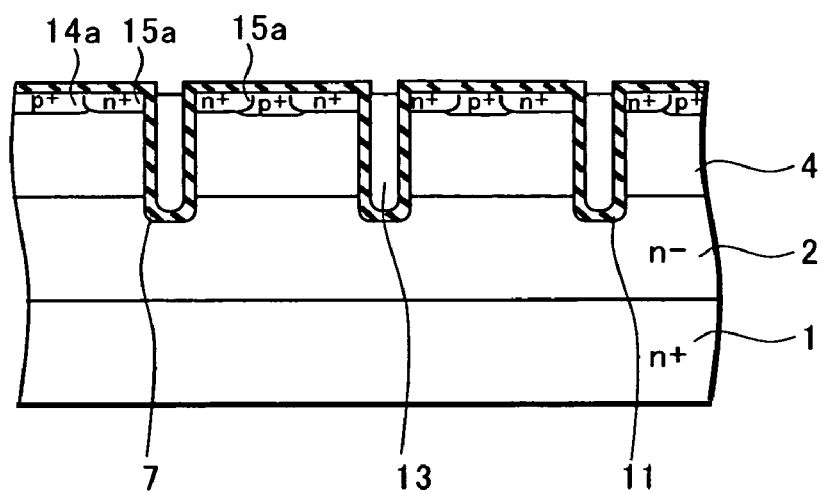
FIGS. 5A and 5B are cross-sectional views showing the method of manufacturing a semiconductor device according to the embodiment of the present invention.

First, a p+ type impurity region 14a is formed by selectively implanting an impurity such as boron ions by using a resist mask (not shown), and the resist mask is removed. Moreover, a new resist mask (not shown) is deposited so as to expose a formation region of the source region and the gate electrode 13. Thereafter, ions of an impurity such as arsenic are implanted to form an n+ type impurity region 15a. Thereafter, the resist mask is removed. Note that, after ion implantation of an n-type impurity, ions of a p-type impurity may be implanted (FIG. 5A).

Figure 5B:
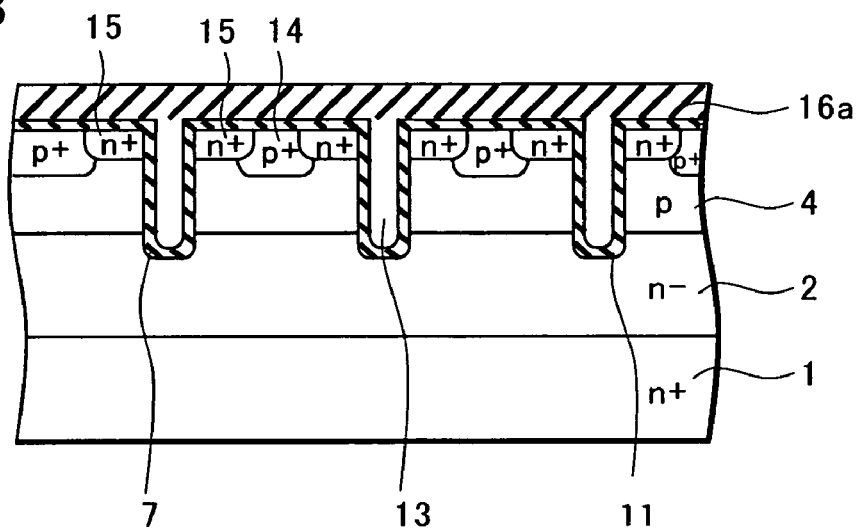
Figure 6:
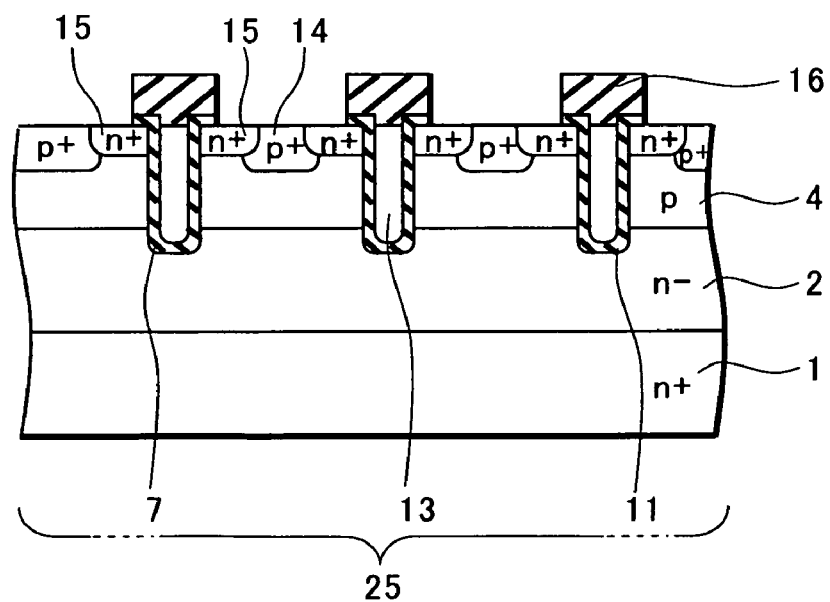
FIG. 6 is a cross-sectional view showing the method of manufacturing a semiconductor device according to the embodiment of the present invention.

Thereafter, a BPSG (Boron Phosphorus Silicate Glass) layer 16a is deposited on the entire surface of the resultant structure by use of the CVD method, and p-type and n-type impurities are diffused in the surface of the substrate. Thus, an n+ type source region 15 is formed in a surface of the channel layer 4 adjacent to the trench 7, and a p-type body region 14 is formed in the surface of the channel layer 4 between the adjacent source regions 15 (FIG. 5B).

Fifth step (see FIG. 6): forming an interlayer insulating film which covers the gate electrode.

Thereafter, the BPSG layer 16a is etched by use of a resist mask, and an interlayer insulating film 16 is left at least on the gate electrode 13. The interlayer insulating film 16 covers the opening of the trench 7, and has the thickness of about 8000 Å.

Sixth step (see FIGS. 7A and 7B): forming a first metal layer which covers above the substrate, comes into contact with the source region and the body region, and has an opening on the interlayer insulating film.

Figure 7A:
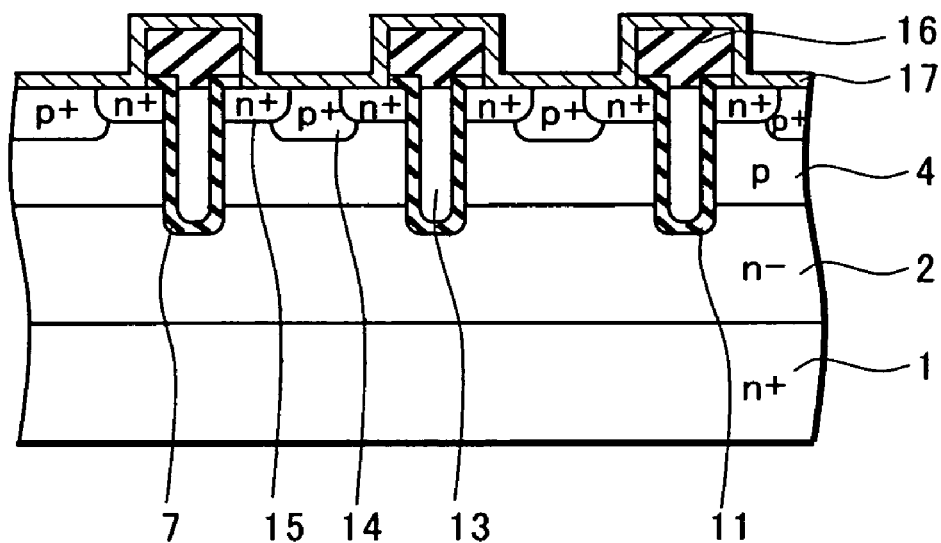
FIGS. 7A and 7B are cross-sectional views showing the method of manufacturing a semiconductor device according to the embodiment of the present invention.

The silicon substrate is exposed in a portion other than the interlayer insulating film 16. Accordingly, if an aluminum alloy to be a wiring layer is sputtered, particles (silicon nodules) of silicon contained in the aluminum alloy may block a contact region with the body region 14 that is a minute region. In order to suppress these silicon nodules and to prevent diffusion of the metal and the silicon substrate, which is called a spike, a titanium-based material (for example, Ti/TiN or the like) is deposited in a thickness of about 0.1 μm on the entire surface of the resultant structure before the wiring layer is formed. Thus, a barrier metal layer 17 is formed (FIG. 7A).

Figure 7B:
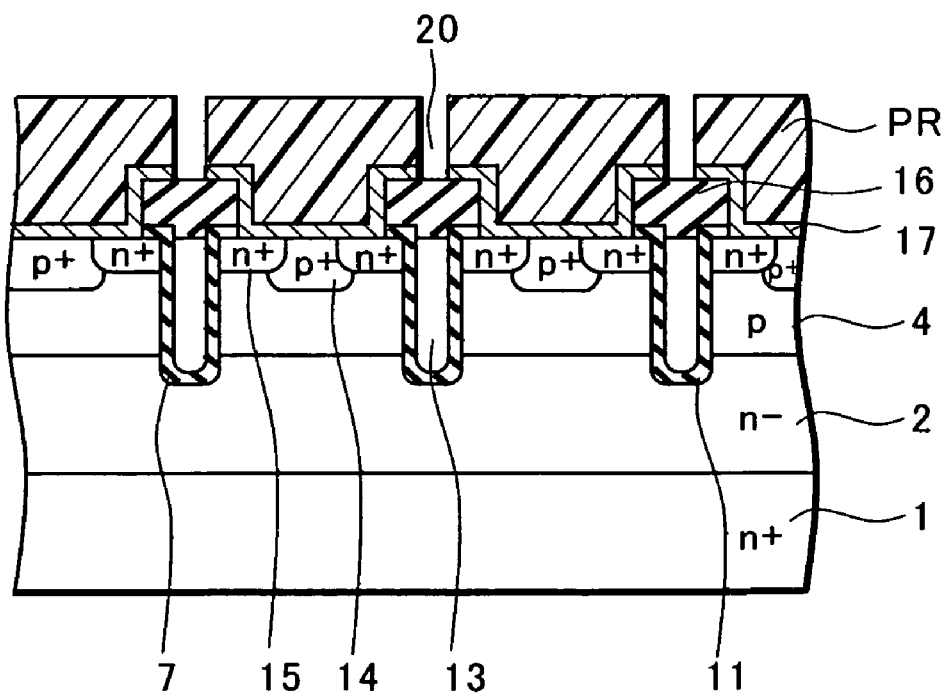
Figure 8:
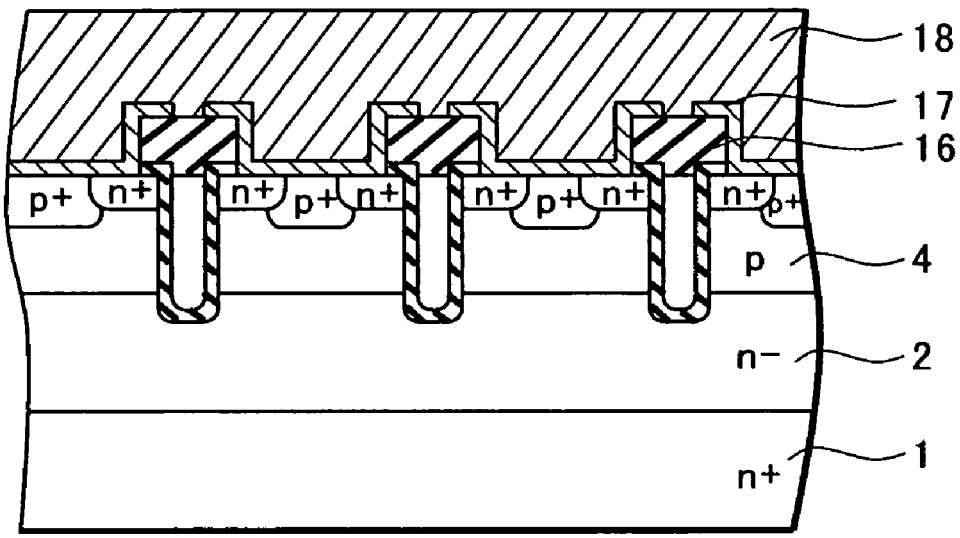
FIG. 8 is a cross-sectional view showing the method of manufacturing a semiconductor device according to the embodiment of the present invention.
Figure 9:
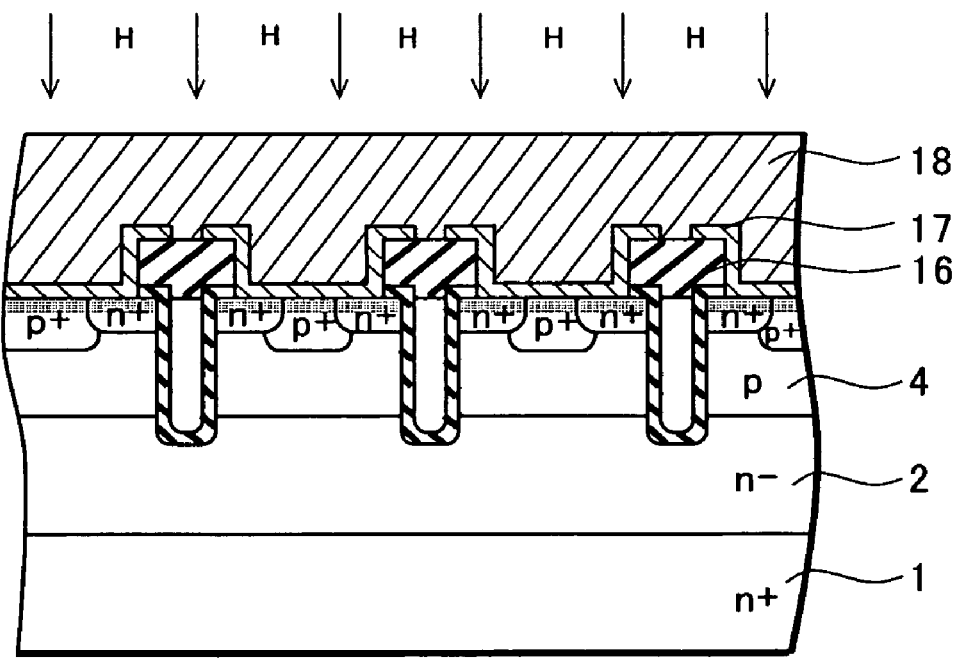
FIG. 9 is a cross-sectional view showing the method of manufacturing a semiconductor device according to the embodiment of the present invention.

Next, as shown in FIG. 7B, an opening is formed. Here, as an etching mask, the resist mask PR used for formation of the trench 7 in the second step is used. The barrier metal layer 17 exposed from the resist mask PR is removed by etching, and the resist mask PR is removed.

Accordingly, an opening 20 is formed in the barrier metal layer 17 on the interlayer insulating film 16. Since the resist mask PR for trench formation is used, the opening 20 has approximately the same opening width as that of the trench 7 (to be more specific, in this step, the opening width of the trench is made slightly larger by dummy oxidation of the trench 7, and the like). By using the resist mask PR for forming the trench 7, the surface of the silicon semiconductor layer (the channel layer 4) is surely covered with the barrier metal layer 17. Moreover, in the barrier metal layer 17 on the interlayer insulating film 16, the opening 20 through which hydrogen penetrates can be formed. Furthermore, since it is not required to form a mask having a new pattern for formation of the opening 20, a cost increase can be prevented.

Seventh step (see FIG. 8): forming a second metal layer on the entire surface of the barrier metal layer.

A second metal layer (for example, an aluminum layer which contained Si) to be a wiring layer 18 is sputtered on the entire surface of the resultant structure. A thickness of the second metal layer is set to about 2 μm. The metal layer covers the barrier metal layer 17 and the opening 20, and is patterned in a desired wiring shape.

Eighth step (see FIG. 9): introducing hydrogen into a surface of the substrate.

Thereafter, heat treatment is performed at 300 to 500° C. (for example, about 400° C.) in a hydrogen gas or hydrogen-containing gas (for example, hydrogen and nitrogen gas) atmosphere. Thus, crystal distortion in the wiring layer 18 is eliminated, and an interface is stabilized.

In this event, even though a part of hydrogen is occluded by the barrier metal layer 17, hydrogen penetrates through the opening 20 formed in the barrier metal layer 17, and is isotropically diffused. Specifically, sufficient hydrogen reaches the surface of the silicon semiconductor layer (the channel layer 4), and charges on the surface of the semiconductor layer can be eliminated.

Thereafter, SiN or the like to be a passivation film 21 is formed. Thus, the final structure shown in FIG. 1 is obtained.

Next, with reference to FIGS. 10A and 10B, description will be given of a relationship between hydrogen annealing and a threshold voltage $V_{GSOFF}$ and an on-resistance ($R_{DSON}$).

Figures 10A, 10B:
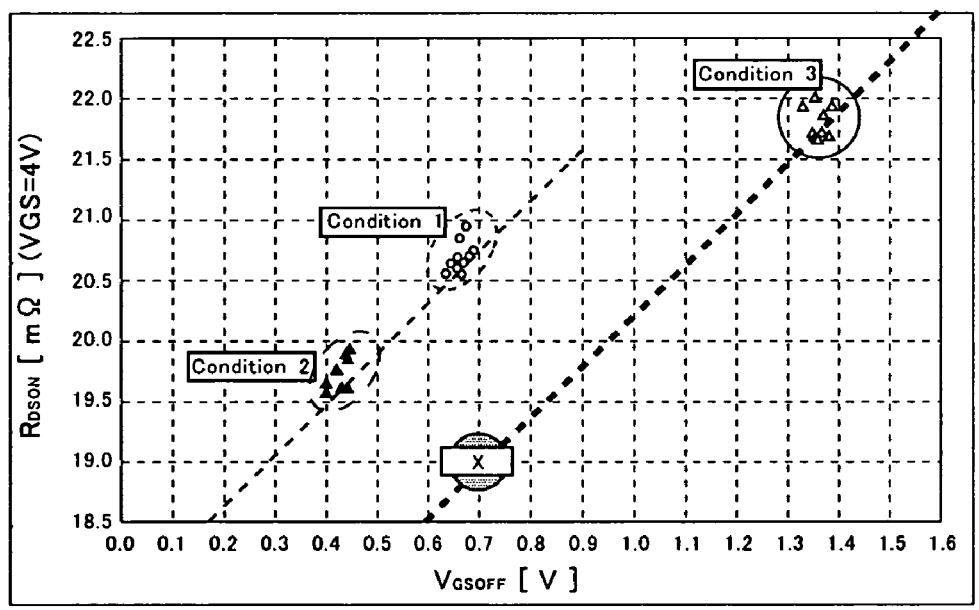
FIGS. 10A and 10B are characteristic diagrams for explaining the semiconductor device according to the embodiment of the present invention.
Figure 11:
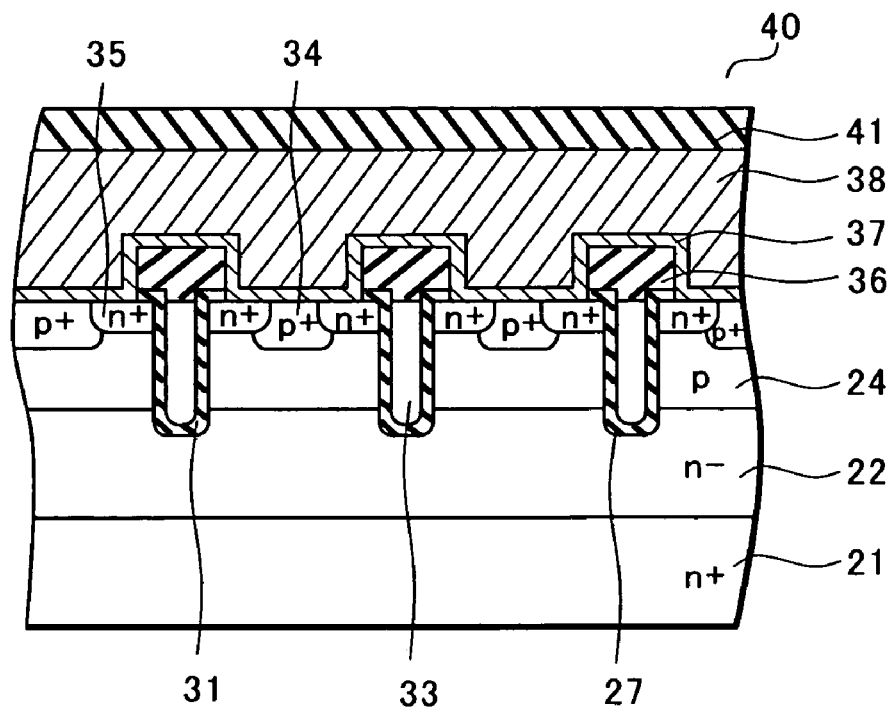
FIG. 11 is a cross-sectional view showing a conventional semiconductor device.
Figure 12:
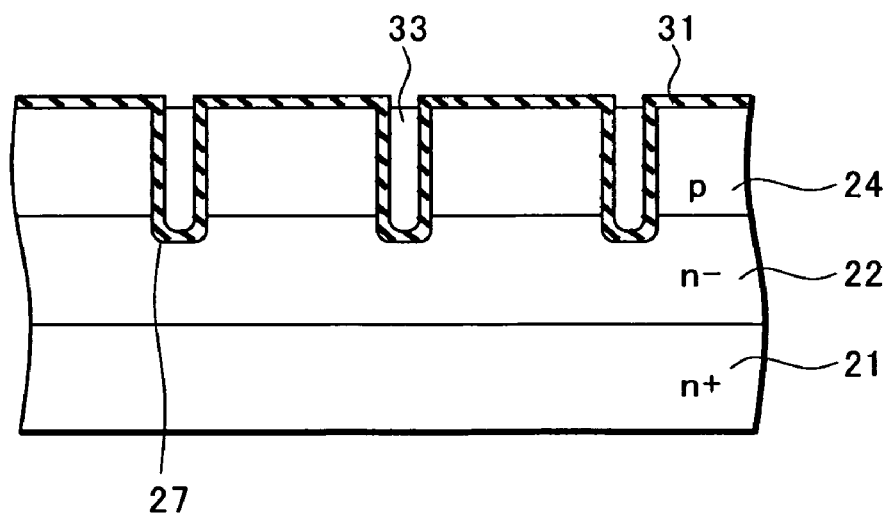
FIG. 12 is a cross-sectional view showing a conventional method of manufacturing a semiconductor device.
Figure 13:
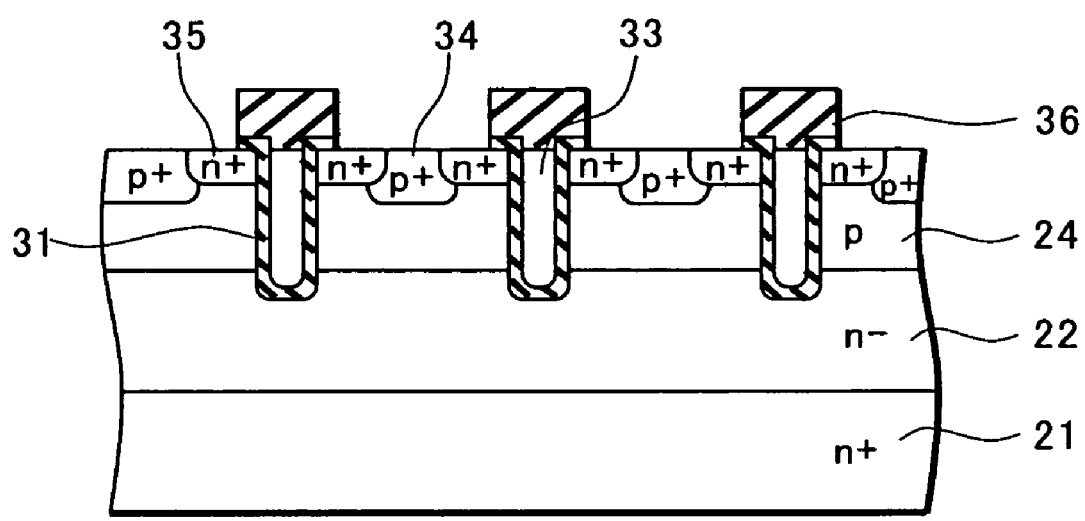
FIG. 13 is a cross-sectional view showing the conventional method of manufacturing a semiconductor device.

FIG. 10A is a comparison table obtained by measuring threshold voltages $V_{GSOFF}$ and on-resistances $R_{DSON}$ under various conditions.

Condition 1 is the case where an impurity concentration in a channel layer is D1, and hydrogen annealing treatment is performed with a barrier metal layer provided.

Condition 2 is the case where the impurity concentration in the channel layer is D2 (D2<D1), and hydrogen annealing treatment is performed with a barrier metal layer provided.

Condition 3 is the case where the impurity concentration in the channel layer is D2, and hydrogen annealing treatment is performed with no barrier metal layer provided.

Note that the above-described condition 3 where no barrier metal layer is provided corresponds to the case where an opening is provided in this embodiment. This is because of the following reason. There is not the barrier metal layer 17 in the opening. As described above, in this embodiment, diffusion of hydrogen proceeds isotropically through the opening. Thus, sufficient hydrogen reaches the surface of the semiconductor layer if an opening having the same opening width as that of the trench 7 is provided to the barrier metal layer 17. Moreover, conditions of each hydrogen annealing treatment are the same.

As a result, under the condition 1, $V_{GSOFF}$=0.67 [V] and $R_{DSON}$=20.7 [mΩ]. Under the condition 2, $V_{GSOFF}$=0.42 [V] and $R_{DSON}$=19.7 [mΩ]. Under the condition 3, $V_{GSOFF}$=1.36 [V] and $R_{DSON}$=21.8 [mΩ].

FIG. 10B shows a correlation diagram between the threshold voltage $V_{GSOFF}$ and the on-resistance $R_{DSON}$ under the respective conditions.

In FIG. 10B, since an amount of impurities implanted into the channel layer 4 is changed between the condition 1 and the condition 2, a line connecting these two conditions becomes an ion implantation amount dependence line.

Here, the threshold voltage $V_{GSOFF}$ is obtained by an equation of $V_{GSOFF}=((2\epsilon s q N_A (2\phi_B))^{(1/2)})/C_O+2\phi_B$. Here, $\epsilon$ s is a dielectric constant, q is a charge $N_A$ is an ion implantation amount in the channel layer, $\phi_B$ is an electrostatic potential, and $C_O$ is an oxide film capacity per unit area. Since $\phi_B$ is proportional to $N_A$, it can be said that the ion implantation amount $N_A$ in the channel layer 4 and the threshold voltage $V_{GSOFF}$ are in a proportional relationship. Therefore, an ion implantation amount dependence line indicated by a thick dashed line can be obtained by moving the ion implantation amount dependence line of the conditions 1 and 2 to the condition 3 in parallel.

According to the thick dashed line, a $V_{GSOFF}$-$R_{DSON}$ correlation is found out in the case where the ion implantation amount is changed in the structure with no barrier metal layer provided (with an opening provided). For example, under the condition 3, although $V_{GSOFF}$ is 1.36 [V], the value is moved to the point X if the desired threshold voltage $V_{GSOFF}$ may be about 0.7V. Specifically, the impurity concentration in the channel layer can be sufficiently reduced compared to that of the condition 3. Thus, the desired threshold voltage $V_{GSOFF}$ can be obtained at a low impurity concentration.

As a result, the on-resistance $R_{DSON}$ can be obtained about 19 [mΩ] and be reduced compared to that of the condition 1.

Note that, although the description was given by taking the MOSFET having the trench structure as an example in this embodiment, the present invention is not limited thereto but can be similarly applied to a horizontal (planar) MOSFET. In this case, by use of a mask for patterning a gate electrode provided in a surface of a substrate, an opening in a barrier metal layer can be formed. However, a resist opposite to that used for patterning the gate electrode is adopted. If a negative resist is used for patterning the gate electrode, for example, a positive resist is used for formation of the opening.

Furthermore, the present invention may also be applied to a MOSFET with a reversed conductivity, and can be similarly applied in an insulating gate type transistor such as an IGBT. Moreover, without being limited thereto, the present invention is applicable as long as a semiconductor device includes an element region formed by diffusing impurities, an insulating film covering a part of the element region, and a metal layer having an opening provided on the insulating film. Moreover, the same effects can be obtained.

What is claimed is:

1. A method of manufacturing a semiconductor device, comprising:
   providing a silicon semiconductor substrate;
   forming an insulating film that covers part of the substrate;
   forming a first metal layer on the substrate and the insulating film, the first metal layer having an opening to expose part of the insulating film at a bottom portion of the opening;
   forming a second metal layer on the first metal layer and the exposed part of the insulating film at the bottom portion of the opening; and
   introducing hydrogen into the substrate through the opening of the first metal layer having the second metal layer therein.

2. The method of claim 1, wherein the second metal layer is formed directly on the first metal layer.

3. A method of manufacturing a semiconductor device, comprising:
   providing a silicon semiconductor substrate of a first general conductivity type;
   forming a channel layer of a second general conductivity type on the substrate;
   forming a gate electrode for the channel layer;
   forming an impurity region of the first general conductivity type in the channel layer and adjacent the gate electrode;
   forming an interlayer insulating film on the gate electrode;
   forming a first metal layer on the channel layer and the interlayer insulating film so as to be in contact with the impurity region, the first metal layer having an opening to expose part of the interlayer insulating film, and the opening and the gate electrode being aligned in a direction normal to a principal plane of the semiconductor substrate;
   forming a second metal layer on the first metal layer and the exposed part of the interlayer insulating film; and
   introducing hydrogen into the channel layer through the opening of the first metal layer.

4. A method of manufacturing a semiconductor device, comprising:
   providing a silicon semiconductor substrate of a first general conductivity type that operates as a drain;
   forming a channel layer of a second general conductivity type on the substrate;
   forming a trench that penetrates through the channel layer;
   filling the trench with a conductive material to form a gate electrode;
   forming a source region of the first general conductivity type in the channel layer and adjacent the gate electrode;
   forming a body region of the second general conductivity type in the channel layer and adjacent the source region;
   forming an interlayer insulating film on the gate electrode;

forming a first metal layer on the channel layer and the interlayer insulating film so as to be in contact with the source region and the body region, the first metal layer having an opening to expose part of the interlayer insulating film, and the opening and the trench being aligned in a depth direction of the trench;

forming a second metal layer on the first metal layer and the exposed part of the interlayer insulating film; and introducing hydrogen into the substrate through the opening of the first metal layer.

5. The method of claim 4, wherein a mask is used both for the forming of the trench and for creating the opening in the first metal film.

6. The method of claim 4, wherein the introducing of hydrogen into the substrate comprises performing a heat treatment of the substrate in a hydrogen atmosphere or in a hydrogen-containing gas atmosphere.

7. The method of claim 6, wherein the heat treatment is performed at 300 to 500° C.

\* \* \* \* \*